United States Patent [19]
Sheridon et al.

[11] Patent Number: 5,136,470
[45] Date of Patent: Aug. 4, 1992

[54] PRINTED CIRCUIT BOARD VIBRATION STIFFENER

[75] Inventors: Timothy M. Sheridon, San Leandro; Stanley R. Ulfeldt, Berkeley, both of Calif.

[73] Assignee: Loral/Rolm Mil-Spec Computers, San Jose, Calif.

[21] Appl. No.: 546,329

[22] Filed: Jun. 29, 1990

[51] Int. Cl.⁵ .................................... H05K 1/14
[52] U.S. Cl. .................... 361/398; 361/414; 174/255
[58] Field of Search ............... 361/398, 392, 394, 395, 361/399, 391, 415, 414; 174/255

[56] References Cited

U.S. PATENT DOCUMENTS

| | | | |
|---|---|---|---|
| 3,259,805 | 7/1966 | Osipchak et al. | 361/388 |
| 3,302,067 | 1/1967 | Jackson et al. | 361/395 |
| 4,429,348 | 1/1984 | Dean | 361/399 |
| 4,439,815 | 3/1984 | Close et al. | 361/398 X |
| 4,758,928 | 7/1988 | Wierec et al. | 361/415 |

*Primary Examiner*—Leo P. Picard
*Assistant Examiner*—Paramita Ghosh

*Attorney, Agent, or Firm*—Skjerven, Morrill, MacPherson, Franklin & Friel

[57] ABSTRACT

A stiffener in the form of a metal-cored stiffener plate is temporarily secured to the underside of a printed circuit (PC) board having a series of integrated circuit (IC) chips and other electronic components and metallization interconnect traces on the upper or top surface of the board. Securing of the stiffening plate and PC board is provided by segments of a hook/mushrooms-containing flexible tape adhered to the PC board underside by suitable adhesive. A complementary sheet of a hooks-containing flexible material is adhered to the stiffening plate such that upon pressing of the complementary material and segments together the respective hooks and loops interlock binding the PC board assembly and stiffening plate assembly together. The securement can be easily undone by grasping and levering the edge of the stiffening plate from the PC board and breaking the interlock of the hooks and loops. The hooks and loops may be reversed on the stiffener plate and on the solder-side of the PC board. They may be the well-known complementary Velcro ® materials.

12 Claims, 3 Drawing Sheets

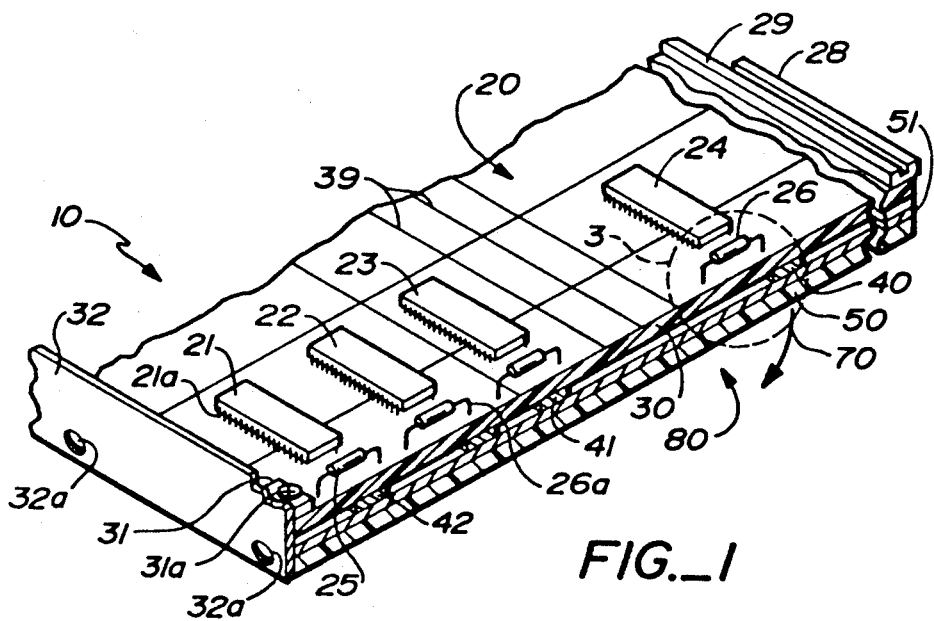
FIG._1
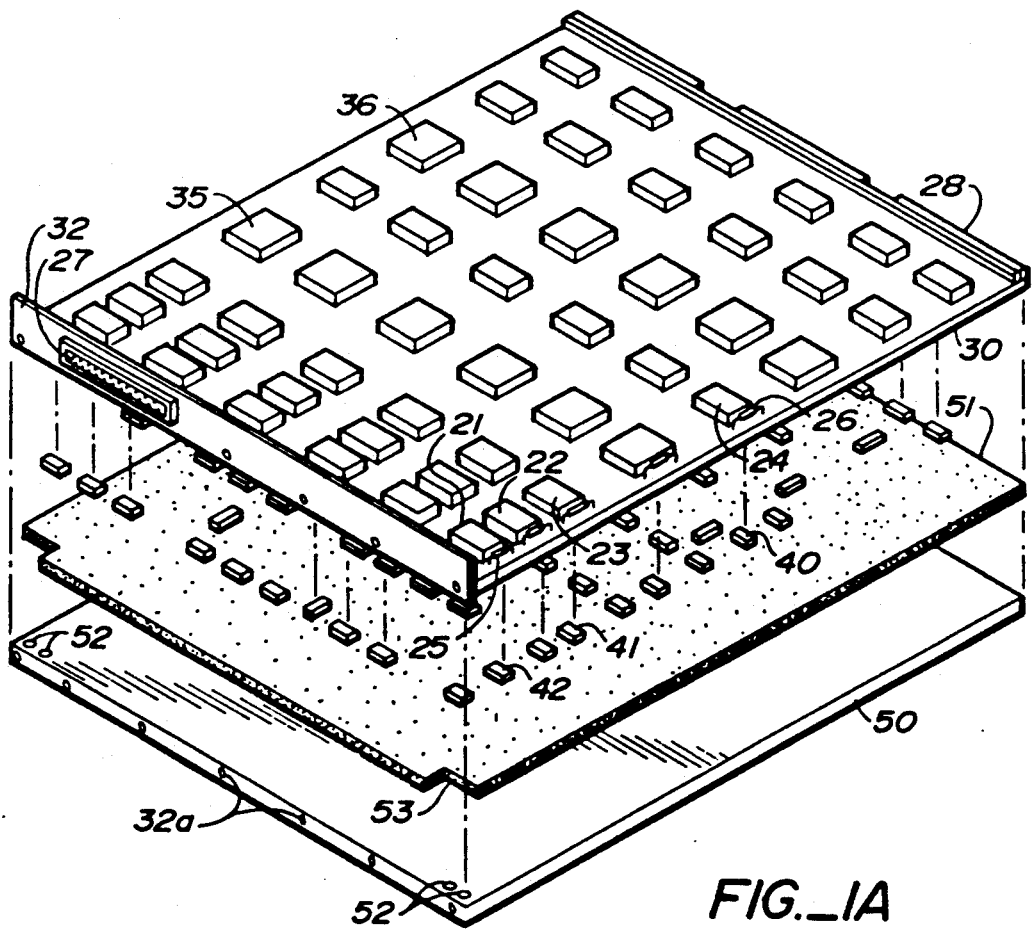
FIG._1A

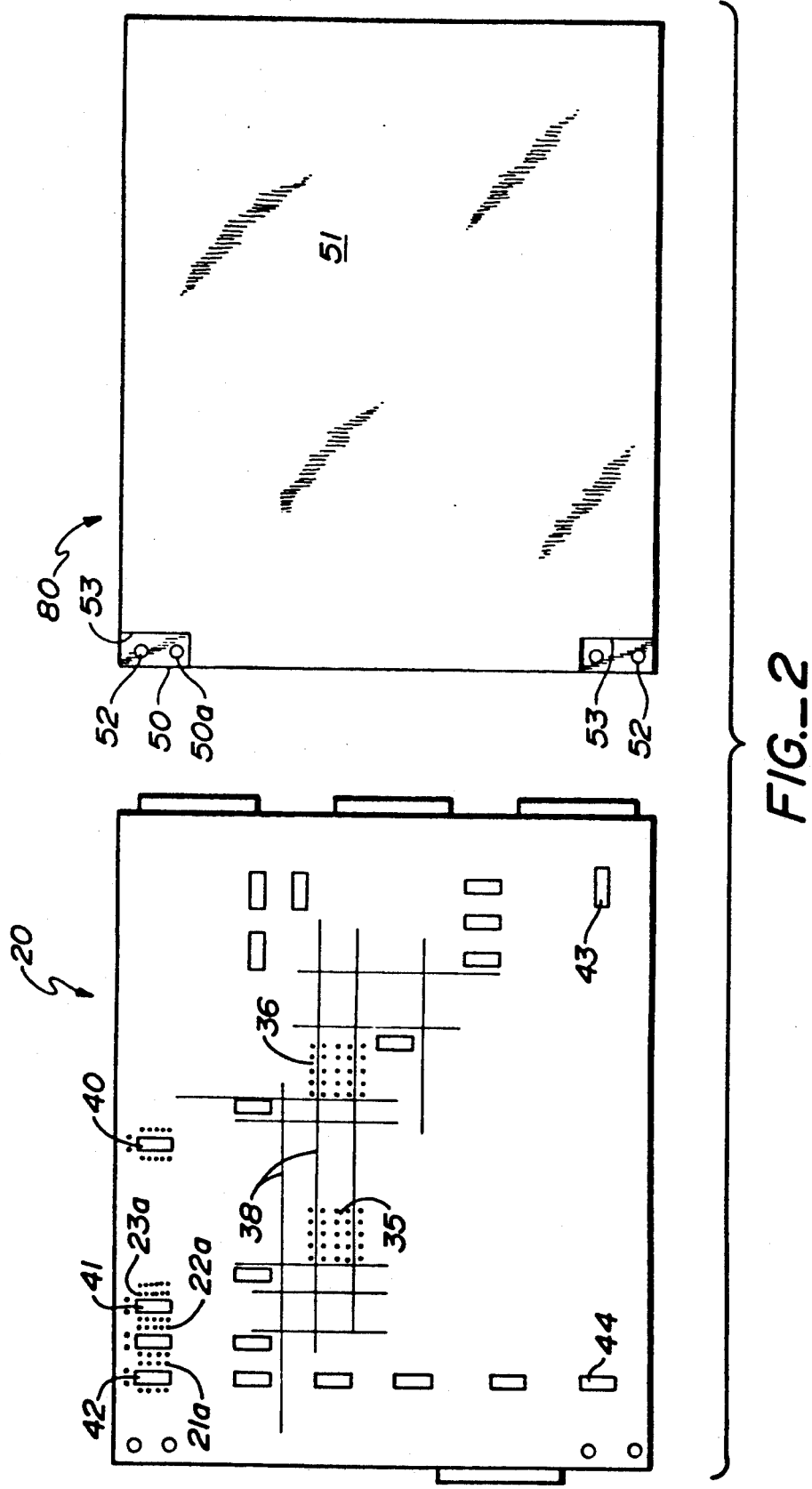
FIG._2

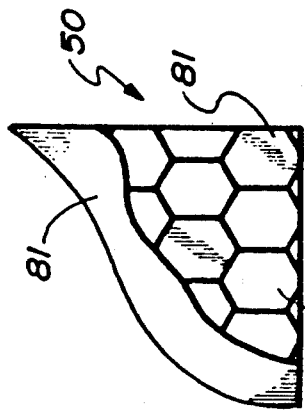
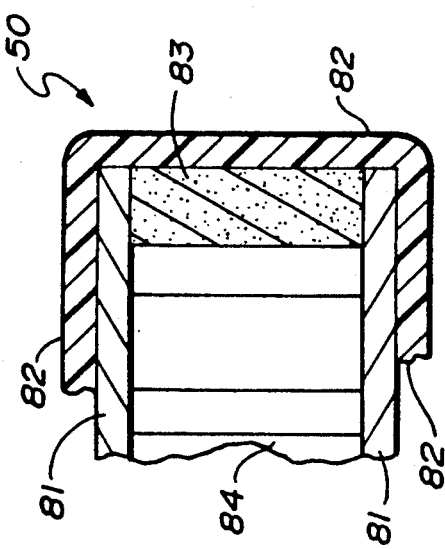
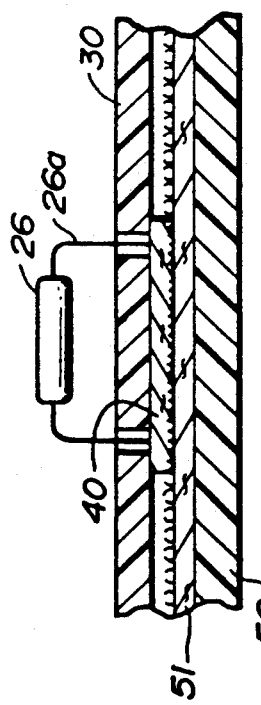
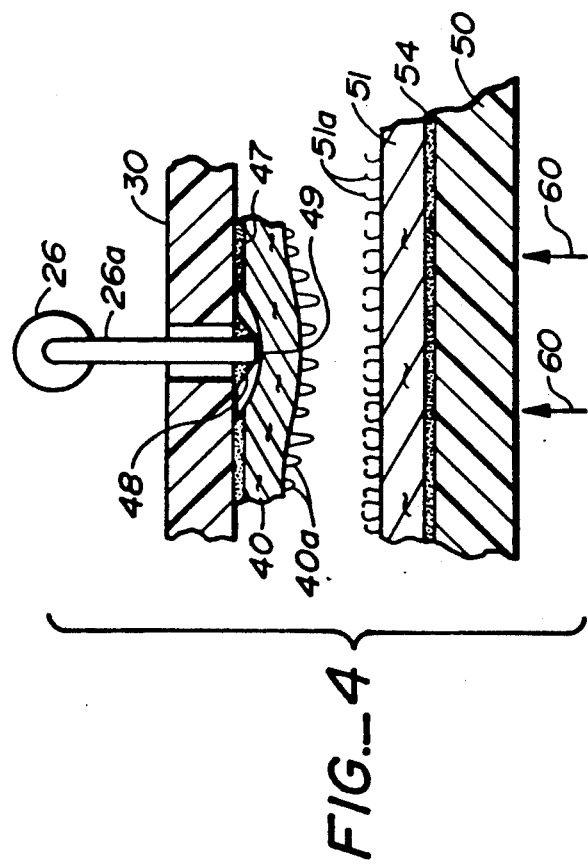

PRINTED CIRCUIT BOARD VIBRATION STIFFENER

BACKGROUND OF THE INVENTION

1. Field of the Invention

This invention is directed to a stiffener for a printed circuit (PC) board. More particular, the invention concerns an easily detachable stiffener which prevents physical vibrations of a PC board and resultant breaking of the PC board interconnect metallization tracings and/or the solder joints between the conductive lead pin fingers of an integrated circuit chip and a conductive via or socket in a PC board.

2. Prior Art

The PC boards currently utilized in the electronic field, particularly for large computers and control equipment for many industrial, aerospace and other transportation applications, are made of relatively thin laminated plastic substrates of G-10 material typically from about 1.2 mm to about 3.0 mm in thickness. As a PC board becomes larger in area and in span between support points the board becomes increasingly more flexible and subject to vibrational damage, dependent primarily on the PC board environment. Amplitudes of up to plus or minus 10 mm have been observed at the center of typical PC boards of a 365 cm by 400 cm rectangular configuration. Metal stiffening frames have been utilized extending peripherally around the PC board. While such frames stiffen the peripheral edges of the PC board, the center of the board still may vibrate substantially from applied vibrational forces. For example, in an aerospace environment such as an aircraft upon take-off, from an airfield or by ship catapult, or under maneuvering exercises, there is much flexing and vibration aboard the craft. While stiffening bars have been proposed and tried they normally add too much additional weight and size. They require real estate for mounting, surrendering space which could be used for mounting electronic components. Such bars are normally of metal to give high stiffness, resulting in possible shorts across electrical connections during vibrational occurrences. Further, it is normally difficult to obtain quick access to the PC board for repairs or testing when previous attempts have been made to lock the board in place against vibration. While PC boards have been made more rugged by using thicker substrates or utilizing integral stiffeners these add size and/or weight, which factors are at a premium in aerospace, man transportable and most other applications.

SUMMARY OF THE INVENTION

The present invention solves the vibrational problems, particularly but not limited to relatively large 37 cm by 40 cm PC board sizes and greater, and relatively thin (1.2 mm to 3.0 mm) PC board substrates by providing a lightweight insulated stiffening plate which spans the reverse side of the PC board. The obverse side of the PC board mounts a predetermined number of integrated circuit (IC) chips and other electronic components, the connecting fingers or connect wires of which are solder attached to vias or sockets extending through the PC board. As is known in the prior art interconnect metallization lines extend from the vias to input and output connections and between leads of the various components.

The insulated plate is constructed of a lightweight metal cellular core coated by a non-electrically conductive (insulation) material such as a urethane-based enamel paint. A sheet of an interlocking resilient material, such as a Velcro ® sheet where a myriad of flexible hooks extend from the surface, is adhered to the insulated plate by suitable adhesive. A series of bands or segments of Velcro ® material, having a myriad of flexible loops extending from their surfaces, is adhered to the PC board between the soldered ends of an array of lead fingers of an IC chip or other locations on the reverse side of the PC board. The number, area and location of the bands is dictated by the holding force desired between the flexible hooks which interlock with the complementary flexible loops.

The insulated stiffening plate is positioned over essentially the entire surface on the reverse side of the PC board so that the complementary hooks and loops interlock when pressed together and the entire PC board is stiffened and vibration dampened by both the interlocked hooks and loops and also by the stiff metal-cored plate. The stiffening plate surface not having the Velcro ® sheet affixed thereto, may be pressed by hand pressure or a roller, such as a rolling pin, to insure a satisfactory interlock of the hooks and loops. If desired a straight frame edge may be affixed to the PC board at a peripheral edge of the board with the PC board substrate fixed by a screw fastener to a right-angled mounting strip affixed to the frame edge. A peripheral edge or a flat portion of the insulated plate may be apertured and screw-connected directly to dedicated areas of the PC board to give additional security to the hooks and loops interlock. The frame edge also functions to align the insulated plate with the PC board with the plate abutting the frame edge and to mount input and output connectors for the overall assembly.

The insulated plate, due to the high rigidity and low weight of the cellular core, its relatively small thickness and the negligible weight of the urethane coating, adds little to the overall weight or thickness of the PC board and its electronic components. In a commercial experimental embodiment the height of the overall assembly, of an about 36 by 40 cm PC board having a 4 mm thickness and having 500 or more electrical components each having a maximum height of about 20 mm, is about 2.0 cm. The stiffening plate and hook/loop securing means of this embodiment only adds about 0.6 cm in thickness to the assembly, without consideration of the additional frame edge having a height of about 2.5 cm. A prototype PC board about 36×40 cm weighing about 18 kg without the stiffener assembly weighs about 20.4 with the stiffener assembly.

BRIEF DESCRIPTION OF THE DRAWING

FIG. 1 is a perspective partial view showing an exterior edge of the overall stiffened PC board assembly.

FIG. 1A is an exploded view of an overall stiffened assembly.

FIG. 2 is an exploded plan view of the facing areas of the underside of a PC board and the insulated stiffening plate.

FIG. 3 is a blown-up detailed cross-sectional view of the circled area in FIG. 1.

FIG. 4 is an exploded detailed cross-sectional view of the fastening means for the connection of the stiffening plate to the PC board.

FIG. 5 is a cut-away plan view of the stiffening plate core.

FIG. 6 is a cross-sectional side view of the stiffening plate core coated with an insulating covering.

DETAILED DESCRIPTION

As seen in FIG. 1 the overall assembly 10 comprises a conventional PC board assembly 20 mounted on a frame straight edge 32 and a stiffener plate assembly 50 mounted on the reverse side (underside or solder-side) of the PC board. The obverse (top or component) side of the PC board mounts a series of IC dual-in-line package (DIP) chips 21, 22, 23 and 24 and additional electronics components, such as quad-in-line IC chips 35 and 36 or resistors 25 and 26. Chip lead frame fingers 21a or connecting wires 26a are pluggable into and extend from the chip through vias or sockets in the PC board and are soldered in place by solder dipping, hand soldering or surface mount with solder. Interconnect metallization pathways 39 of copper, silver or the like are plated on the relatively flexible PC board substrate 30 to interconnect the IC chip contacts and other electronics contacts (connection fingers or wires) and appropriate contacts on input and output connectors 27 and 28 at edges of the assembly. Metallization pathways 38 are typically employed extending from one solder joint to another on the reverse side of the PC board.

The PC board is preferably mounted on a pair or more of right-angled metal mounting strips 31 extending from and attached to straight edge frame part or strip 32. The PC board substrate 30 may be held down on the mounting strips 31 by screws 31a. The PC board front/card top is mounted to strip 32 and installed in a PC card cage or mounted on a chassis.

A stiffening plate assembly 80 comprising a metal-cored plate 50 covered by an electronically insulating coating (FIG. 6) and securing means 40 and 51 is removably positioned against substantially the entire reverse side of the finished PC board. "Substantially" as used herein may be about two-thirds or more of the PC board area since a relatively large are of the board normally requires stiffening. If needed the stiffening plate assembly 80 may be screwed in the overall assembly 10 by screws 32a extending through apertures in edge strip 32 into the peripheral edge of plate 50. The stiffening plate assembly 80 may also be additionally fastened to the substrate 30 by screws (not shown) extending through the stiffening plate into the substrate 30. Cutouts may be provided in the stiffener board particularly to accommodate components which may be mounted on the solder-side of the board or extend therefrom. The edge strip 32 orthogonal to the substrate 30 also serves to align the stiffening plate since one edge of the plate may abut the inside surface of the edge strip 32 in assembly and use. A portion of strip 32 extends below substrate 30 and mounting strips 31 to serve as an alignment or abutment surface. The stiffener plate assembly 80 comprises the metal-cored plate 50 covered by insulation 82 and a sheet 51 of Velcro ® flexible fastening material extending over and adhered by adhesive 54 preferably on essentially all of the plate top surface. Multiple pads of Velcro material can be employed. The Velcro ® sheet includes a myriad of flexible hooks 51a as is known in the fastening art. A series of complementary Velcro ® tape segments 40, 41 and 42 having a myriad of flexible closed loops 40a are adhered by adhesive 47 to spaced areas on the underside of the PC board substrate 30. The adhesive 47, 54 may be a pressure sensitive adhesive such as standard PSA adhesive or 915 adhesive manufactured by Aplix or 3M. These segments may be in spaced rows and ranks and may bridge between or across the soldered ends of the IC chip fingers, leads, or other component leads. The number of tape segments 40, 41 and 42 employed is dictated by the desired holding power of the mating interlock between the hook and loops of the complementary fastening sheets and segments Each square inch of complementary abutting Velcro ® materials will have a holding power of from about 2 to about 4.5 Kg. Velcro tape for the tape segments and the Velcro sheets are available from Aplix Inc. of Charlotte, N. C. under Part Nos. Mushroom 200 and Loop 200, respectively or other hook and loop combinations.

FIG. 2 shows the placement of rectangular Velcro ® tape segments 44 of about 1 cm by 3 cm in various areas on the underside of the PC board. The input connector 27 and output plug connections 28 extend from and are held by strip 32 at one edge of the PC board and a support channel 29 at the opposite edge, respectively. Strip 32 and channel 29 are not critical in all applications. There is no need of side supporting edges forming a complete frame around the PC board. A cutout 53 may be included in fastening sheet 51 to accommodate screw fastener heads connecting the PC board 30 to the angles 31. The Velcro ® material may be in the form of Velfoam ® material in which the myriad of nylon hooks (or nylon loops) are formed on a foamed nylon base material or other woven, knitted, molded and elastic nylon, polyester, polypropylene and other plastic elements.

FIG. 3 is a detailed view of the fastener interconnection showing a resistor 26 extending above the board substrate 30 and resistor wire leads 26a extending through a via 30a in the substrate. Leads 26a are normally dip soldered in the substrate 30 and have a tip portion extending just below the substrate. A solder collar 48 connects the lead to appropriate metallization pathways 38 on the PC board underside. The fastener tape segments 40, 41 and 42 may overlie or be spaced between these soldered tip ends. The hooks 51a and loops 40a of the complementary Velcro ® fastener portions 51 and 40 upon pressing together, interlock as shown.

FIG. 4 illustrates the PC board assembly 20 and stiffening plate assembly 80 just prior to pressing one against the other. A rolling or pressing force (arrows 60) is applied to move the assemblies into interlocking contact. A rolling pen may be used to roll the assemblies together. As illustrated in FIG. 1 the stiffening plate assembly 80 can be easily removed from the PC board assembly 20 by grasping an edge of the stiffening plate 50 and "peeling" or levering it away from the PC board as indicated by arrow 70 so that the hooks and loops disengage to separate the assemblies 20 and 80. This allows access to the PC board underside for checking, testing or repair of the soldered contacts.

The insulated stiffness plate 50 is preferably comprised of a metal-cored plate having a series of internal thin aluminum strips formed as hexagonal cells 84 covered by top and bottom aluminum thin (0.2 mm) face plates 81. The cell ends exposed from cutting the metal core to size may be filled with putty 83 such as a plastic filler (Bonco) to give a smooth edge contour. Such cored plate is commercially available from Hexcel Corp. of Arizona and sold under the trademark Hexcel ®. The lightweight, stiff stiffener plate 50 typically has a thickness of about 0.3 mm. (0.2 mm) and a weight of about 2.77 kg (0.5 pounds) per piece. A polyurethane enamel paint 82 such as Inron available from DuPont is coated in a thickness of about 0.05 mm completely around the Hexcel ® cored plate including the putty-filled end sections to provide exterior electrical insulation over the entire exterior surfaces of the cored plate.

The above description of the preferred embodiment of this invention is intended to be illustrative and not limiting. Other embodiments of this invention will be obvious to those skilled in the art in view of the above disclosure.

We claim:

1. In combination a printed circuit board comprising:
   an electrically insulative flexible substrate having outer linear peripheral edges;
   a series of electrical vias extending through said substrate;
   interconnect circuitry on a first obverse surface of said substrate for connecting various of said vias;
   a series of electrical components having connector lead fingers connected to said vias and said substrate; and
   means on a reverse second surface of said substrate for soldering said lead fingers in said vias and said substrate, said reverse second surface having a generally planar configuration; and
   means for stiffening said printed circuit board and for damping vibrations within said substrate, said stiffening means comprising:
   a detachable relatively stiff lightweight insulated generally imperforate stiffening plate sized to extend substantially over said reverse second surface of said substrate and having outer linear peripheral edges generally contiguous to the outer linear edges of said substrate;
   securing means for detachably securing said insulated stiffening plate to said reverse second surface of said substrate; and
   wherein said securing means comprises a flexible resilient material having complementary parts which adhere to one another when pressed together, one of said parts being adhesively affixed to said substrate second surface between solder connections thereon and the other of said parts being affixed to and extending substantially over all of a facing surface of said insulated stiffening plate.

2. The combination of claim 1 wherein said substrate second surface includes interconnect circuitry and one of said complementary parts includes a series of individual segments extending in rows and ranks on said substrate second surface and said other of said complementary parts comprises a single sheet of flexible resilient material extending substantially over all of facing surface of said insulated stiffening plate.

3. In combination a printed circuit board comprising:
   an electrically insulative flexible substrate having outer linear peripheral edges;
   a series of electrical vias extending through said substrate;
   interconnect circuitry on a first obverse surface of said substrate for connecting various of said vias;
   a series of electrical components having connector lead fingers connected to said vias and said substrate; and
   means on a reverse second surface of said substrate for soldering said lead fingers in said vias and said substrate, said reverse second surface having a generally planar configuration; and
   means for stiffening said printed circuit board and for damping vibrations within said substrate, said stiffening means comprising:
   a detachable relatively stiff lightweight insulated generally imperforate stiffening plate sized to extend substantially over said reverse second surface of said substrate and having outer linear peripheral edges generally contiguous to the outer linear edges of said substrate;
   securing means for detachably securing said insulated stiffening plate to said reverse second surface of said substrate; and
   wherein said stiffening plate comprises a metallic cellular core plate covered by a plastic coating and wherein said securing means comprises a first flexible resilient material fixedly attached to said reverse second surface of said substrate and a second flexible resilient material fixedly attached to a surface of said stiffening plate, and first and second flexible resilient materials being pressable together to detachably secure said first and second materials together.

4. The combination of claim 3 wherein said first and second flexible resilient materials include a myriad of hooks and loops, respectively, for temporarily bonding said stiffening plate to said reverse second surface of said substrate.

5. In combination a printed circuit board comprising:
   an electrically insulative flexible substrate having outer linear peripheral edges;
   a series of electrical vias extending through said substrate;
   interconnect circuitry on a first obverse surface of said substrate for connecting various of said vias;
   a series of electrical components having connector lead fingers connected to said vias and said substrate; and
   means on a reverse second surface of said substrate for soldering said lead fingers in said vias and said substrate, said reverse second surface having a generally planar configuration; and
   means for stiffening said printed circuit board and for damping vibrations within said substrate, said stiffening means comprising:
   a detachable relatively stiff lightweight insulated generally imperforate stiffening plate sized to extend substantially over said reverse second surface of said substrate and having outer linear peripheral edges generally contiguous to the outer linear edges of said substrate;
   securing means for detachably securing said insulated stiffening plate to said reverse second surface of said substrate; and
   in which said securing means comprises a predetermined number of segments of flexible resilient material having a myriad of tiny loops thereon affixed to said reverse second surface of said substrate and a sheet of flexible resilient material having a myriad of tiny hooks thereon affixed to said stiffening plate, said loops and hooks being placed in a mating interlocking bind when said stiffening plate is pressed against said reverse second surface of said substrate.

6. In combination a printed circuit board comprising:
   an electrically insulative flexible substrate having outer linear peripheral edges;
   a series of electrical vias extending through said substrate;

interconnect circuitry on a first obverse surface of said substrate for connecting various of said vias;

a series of electrical components having connector lead fingers connected to said vias and said substrate; and means on a reverse second surface of said substrate for soldering said lead fingers in said vias and said substrate, said reverse second surface having a generally planar configuration; and means for stiffening said printed circuit board and for damping vibrations within said substrate, said stiffening means comprising:

a detachable relatively stiff lightweight insulated generally imperforate stiffening plate sized to extend substantially over said reverse second surface of said substrate and having outer linear peripheral edges generally contiguous to the outer linear edges of said substrate;

securing means for detachably securing said insulated stiffening plate to said reverse second surface of said substrate; and further including a straight edge frame part extending orthogonally to said substrate; means affixing said substrate to said frame part; and wherein said frame part edge extends below said reverse second surface of said substrate a fixed distance, said stiffening plate having a thickness substantially the same as said fixed distance such that said insulation is abutted and aligned into said frame part edge.

7. The combination of claim 6, further including a series of mechanical fasteners extending through said frame part edge into a facing edge of said substrate to removably fix said substrate and said stiffening plate together.

8. The combination of claim 6, further including a series of apertures in said stiffening plate and connector means extending from said stiffening plate to said frame part edge through said apertures to secure said stiffening plate and said substrate together.

9. In combination a printed circuit board comprising:

an electrically insulative flexible substrate having outer linear peripheral edges;

a series of electrical vias extending through said substrate;

interconnect circuitry on a first obverse surface of said substrate for connecting various of said vias;

a series of electrical components having connector lead fingers connected to said vias and said substrate; and means on a reverse second surface of said substrate for soldering said lead fingers in said vias and said substrate, said reverse second surface having a generally planar configuration; and means for stiffening said printed circuit board and for damping vibrations within said substrate, said stiffening means comprising:

a detachable relatively stiff lightweight insulated generally imperforate stiffening plate sized to extend substantially over said reverse second surface of said substrate and having outer linear peripheral edges generally contiguous to the outer linear edges of said substrate;

securing means for detachably securing said insulated stiffening plate to said reverse second surface of said substrate; and in which said securing means comprises a series of tape segments, having a myriad of outwardly-facing flexible loops thereon, affixed on said reverse second surface of said substrate and a sheet of flexible material, having a myriad of outwardly-facing flexible hooks thereon, affixed to said stiffening plate, said stiffening plate being pressable onto said substrate reverse second surface such that said loops and hooks interlock to bind said stiffening plate to said substrate.

10. In combination a printed circuit board comprising:

an electrically insulative flexible substrate having outer linear peripheral edges;

a series of electrical vias extending through said substrate;

interconnect circuitry on a first obverse surface of said substrate for connecting various of said vias;

a series of electrical components having connector lead fingers connected to said vias and said substrate; and means on a reverse second surface of said substrate for soldering said lead fingers in said vias and said substrate, said reverse second surface having a generally planar configuration; and means for stiffening said printed circuit board and for damping vibrations within said substrate, said stiffening means comprising:

a detachable relatively stiff lightweight insulated generally imperforate stiffening plate sized to extend substantially over said reverse second surface of said substrate and having outer linear peripheral edges generally contiguous to the outer linear edges of said substrate;

securing means for detachably securing said insulated stiffening plate to said reverse second surface of said substrate; and in which said stiffening plate has a stiff cellular core and said securing means comprises a myriad of hooks and loop respectively attached to said stiffening plate and said substrate.

11. In combination, a stiffener and a flexible flat printed circuit board having a series of electronic components including integrated circuit chips affixed on a first obverse flat surface on a board substrate, said board substrate having chip connections extending to a second reverse substantially flat surface of said board substrate; said stiffener comprising a lightweight insulated plate in contiguous relationship with said printed circuit board and of sufficient thickness to minimize vibrational movement of said board substrate and said chip connections in use, and including securing means for detachably securing said insulated plate to said board substrate reverse substantially flat surface; and in which said securing means comprises a myriad of resilient hooks and a myriad of resilient loops attached to said insulated plate and to said board substrate reverse substantially flat surface for interlock binding said hooks and loops and said insulated plate and said board substrate together.

12. The combination of claim 11 in which said insulated plate includes an aluminum hexagonal cellular core and facing sheets covered with an electrically insulative coating, said myriad of hooks being attached to said coating and said myriad of loops being attached to said board substrate reverse surface, said plate being detachable from said board substrate by levering said plate from said board substrate, and releasing said hooks from said interlock binding.

* * * * *